United States Patent [19]

Beeck

[11] Patent Number: 4,642,592
[45] Date of Patent: Feb. 10, 1987

[54] GROUNDING AND SUPPORTING METAL MESH

[75] Inventor: Carlos L. Beeck, Aloha, Oreg.

[73] Assignee: Tektronix, Inc., Beaverton, Oreg.

[21] Appl. No.: 727,947

[22] Filed: Apr. 26, 1985

[51] Int. Cl.$^4$ .............................................. H01P 1/00
[52] U.S. Cl. .................................. 333/246; 333/99 R; 245/8; 267/147; 267/154
[58] Field of Search .................... 333/238, 246, 99 R; 267/80, 147, 154, 158, 165, 182; 245/8; 174/35 GC

[56] References Cited

U.S. PATENT DOCUMENTS

| | | | |
|---|---|---|---|
| 2,125,583 | 8/1938 | Reed | 245/8 |
| 3,206,536 | 9/1965 | Goodloe | 174/35 GC |
| 3,274,459 | 9/1966 | Sterzer | 333/238 |
| 3,329,378 | 7/1967 | Stanton | 245/8 |
| 3,521,202 | 7/1970 | Russell | 333/246 |
| 3,739,302 | 6/1973 | McManus | 333/238 X |

*Primary Examiner*—Paul Gensler
*Attorney, Agent, or Firm*—Francis I. Gray

[57] ABSTRACT

A grounding and supporting metal mesh provides connection between a circuit board with a cavity and a housing. The mesh is in the form of a spring made by interconnected torsional members. The mesh is plated with a metal which is compatible with the ground planes of the circuit board and housing.

2 Claims, 4 Drawing Figures

GROUNDING AND SUPPORTING METAL MESH

BACKGROUND OF THE INVENTION

1. Field of the Invention

The present invention relates to means for connecting a circuit to a housing, and more particularly to a grounding and supporting metal mesh to connect the ground plane of a circuit board to the ground plane within a cavity of a housing.

2. Description of the Prior Art

Prior techniques for connecting a circuit board within a cavity of a housing either (1) placed the circuit board directly on the metal base within the cavity and secured the circuit board in place; or (2) used a silver impregnated silicone cushion between the circuit board and housing within the cavity. The first technique often resulted in cracking of the circuit board, and the second technique was expensive and used an incompatible material.

SUMMARY OF THE INVENTION

Accordingly, the present invention provides a grounding and supporting metal mesh for connecting a circuit board within a cavity to a housing. The mesh is in the form of a spring made by interconnected torsional members. The mesh is plated with a metal which is compatible with the ground planes of the circuit board and housing.

The objects, advantages and novel features of the present invention will be apparent from the following detailed description when read in conjunction with the appended claims and attached drawing.

DESCRIPTION OF THE PREFERRED EMBODIMENT

Figure 1:
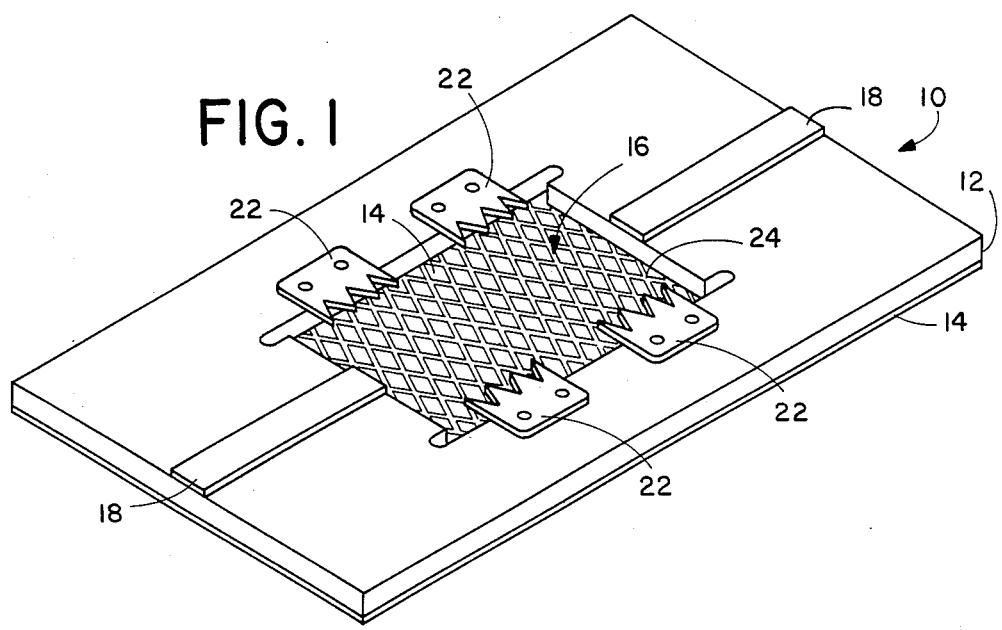
FIG. 1 is a perspective view of a housing having a metal mesh according to the present invention.
Figure 2:
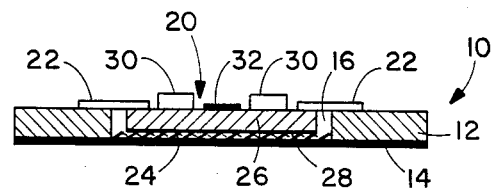
FIG. 2 is a cross-sectional view of a circuit board mounted within the housing of FIG. 1 using the metal mesh according to the present invention.

Referring now to FIGS. 1 and 2 a housing 10 is shown having a substrate 12 and a ground plane 14. A cavity 16 is formed in the substrate 12 to expose the ground plane 14. Transmission line 18 on the surface of the substrate 12 leads to the cavity 16 for connection to a hybrid circuit board 20 when inserted therein. Clamps 22 are attached to the substrate 12 and extend over the cavity 16 to secure the hybrid circuit board 20 in place within the cavity. A metal mesh 24 is inserted in the bottom of the cavity 16 to contact the housing ground plane 14.

The hybrid circuit board 20 has a carrier substrate 26 with a bottom ground plane 28 and surface components 30 connected to a surface transmission line 32. The circuit board 20 is inserted within the cavity 16 so that the bottom ground plane 28 contacts the mesh 24, and is then secured in place by the clamps 22. Conventional means may be used to electrically connect the housing transmission lines 18 to the circuit transmission line 32.

Figure 3:
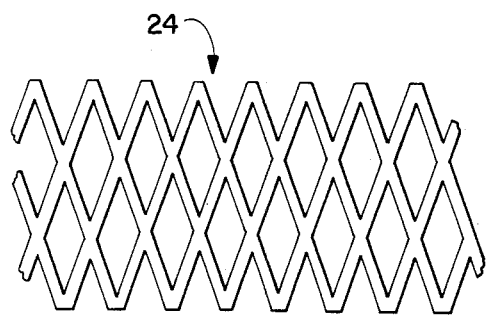
FIG. 3 is a plan view of the metal mesh according to the present invention.
Figure 4:
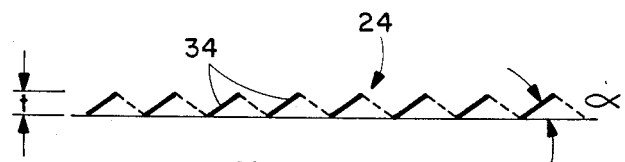
FIG. 4 is a diagrammatic side view of the metal mesh according to the present invention.

As shown in FIGS. 3 and 4 the mesh 24 has an open latticework construction and is essentially a plurality of interconnected torsion springs 34. The mesh 24 has a thickness $t$ and the springs 34 each form an angle $\alpha$. The mesh 24 is formed by a chemically milled or punched array of slits each defining a rectangular cross-section torsion bar affixed at the nodes such that when expanded to a desired lozenge configuration cell it retains the expanded metal diamond shape that has the angle $\alpha$ to the torsional spring nodes, providing the thickness $t$ as well as springiness. Given the variables of thickness, width and length, the mesh 24 can be designed to be a "soft" cushion up to a hard or stiff cushion. The mesh 24 makes metallic contact with the respective ground planes 14, 28 at the nodes, thus giving a multiplicity of contacts to support a grounding plane. The material of the mesh 24 is beryllium/copper or the like plated with a conductive material, such as nickel, tin, gold or the like, which is compatible with the materials of the respective ground planes 14, 28. For example, nickel would be appropriate for connecting aluminum to gold.

Thus, the present invention provides a grounding and supporting expanded metal mesh which serves as a cushion and a ground connection between a hybrid circuit board and the ground plane within the cavity of a housing, and also serves to protect the hybrid circuit board from uneven stress and shock.

What is claimed is:

1. A metal mesh for electrically connecting the ground plane of a circuit board to the ground plane of a housing comprising a conductive material having an array of slits each defining a rectangular cross-section torsion bar affixed at the nodes such that when expanded each node forms a torsion spring, the material being a beryllium/copper alloy plated with a metal compatible with the material of said ground plane which is selected from the group consisting of nickel, tin and gold.

2. A hybrid circuit package comprising:
   a housing having a ground plane and a cavity exposing said ground plane;
   a metal mesh in the form of a plurality of torsion bars affixed at nodes to form a plurality of springy electrical contact points, said mesh being inserted within said cavity and having a certain thickness;
   a circuit board having a background plane, said circuit board being inserted in said cavity such that said background plane contacts said metal mesh; and
   means for securing said circuit board within said cavity so that said metal mesh provides a cushion and electrical connection between said housing ground plane and said background plane.

* * * * *